United States Patent
Jung et al.

(10) Patent No.: US 10,770,132 B1
(45) Date of Patent: Sep. 8, 2020

(54) SRAM WITH BURST MODE ADDRESS COMPARATOR

(71) Applicant: QUALCOMM Incorporated, San Diego, CA (US)

(72) Inventors: Changho Jung, San Diego, CA (US); Keejong Kim, Phoenix, AZ (US); Arun Babu Pallerla, San Diego, CA (US); Chulmin Jung, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/523,768

(22) Filed: Jul. 26, 2019

(51) Int. Cl.
    *G11C 11/418*  (2006.01)
    *G11C 11/419*  (2006.01)

(52) U.S. Cl.
    CPC .......... *G11C 11/418* (2013.01); *G11C 11/419* (2013.01)

(58) Field of Classification Search
    CPC ............................ G11C 11/418; G11C 11/419
    USPC ...................................................... 365/233.18
    See application file for complete search history.

(56) References Cited

U.S. PATENT DOCUMENTS

| | | | | |
|---|---|---|---|---|
| 6,510,097 | B2 * | 1/2003 | Fukuyama | G11C 7/1021 365/230.03 |
| 7,225,318 | B2 * | 5/2007 | Tran | G06F 12/0215 711/137 |
| 2002/0110037 | A1 * | 8/2002 | Fukuyama | G11C 8/12 365/230.03 |
| 2005/0081014 | A1 * | 4/2005 | Tran | G06F 12/0215 711/213 |
| 2020/0073806 | A1 * | 3/2020 | Hayakawa | G06F 12/0815 |

* cited by examiner

*Primary Examiner* — Fernando Hidalgo
(74) *Attorney, Agent, or Firm* — Qualcomm Incorporated

(57) ABSTRACT

A memory is provided that is configured to practice both a normal read operation and also a burst mode read operation. A burst mode address comparator compares a current row address to a previous row address to determine whether a read operation is a normal read operation or a burst mode read operation.

22 Claims, 6 Drawing Sheets

SRAM WITH BURST MODE ADDRESS COMPARATOR

TECHNICAL FIELD

This application relates to memories, and more particularly to a low-power memory.

BACKGROUND

In a conventional static random-access memory (SRAM), a bitcell connects to a pair of bit lines during a read operation. Prior to the read operation, the bit lines are pre-charged to the power supply voltage used for the bitcell. Depending upon the binary content of the bitcell, the bitcell will slightly discharge either the true bit line or the complement bit line in the bit line pair from its pre-charged state. For example, suppose that the bitcell is storing a binary one. During a read operation, a word line is asserted so that the bitcell is coupled to its bit line pair. Due to the binary one value, the complement bit line will then be discharged from its pre-charged state. But the bitcell will maintain the true bit line at its pre-charged state. The read operation will thus develop a voltage difference across the bit line pair. This bit line voltage difference is not full rail but instead equals a fraction of the power supply voltage. For example, if the power supply voltage is one volt, the voltage difference may be just 100 millivolts or less. To respond to this relatively small voltage difference and make a bit decision as to what was stored in the bitcell, a typical sense amplifier requires a relatively large amount of gain.

Accordingly, there is a need in the art for memories having increased density and improved power efficiency.

SUMMARY

A memory is disclosed that includes: a plurality of latches configured to store a previous row address for the memory; a first plurality of logic gates configured to assert a bit comparison word responsive to a current row address for the memory equaling the previous row address; a first transistor having a terminal coupled to a burst mode node for a burst mode signal; and a second plurality of logic gates configured to switch on the first transistor to ground the burst mode node responsive to the assertion of the bit comparison word.

In addition, a burst-mode method for a memory is disclosed that includes: pre-charging a sense amplifier in a first read cycle; latching a bit decision in the sense amplifier after the pre-charging in the first read cycle; in a second read cycle following the first read cycle, asserting a burst mode signal for a portion of the second read cycle responsive to a row address for the second read cycle equaling a row address for the first read cycle; transferring the bit decision latched in the sense amplifier to a data output latch without pre-charging the sense amplifier during the second read cycle responsive to the assertion of the burst mode signal.

Finally, a memory is disclosed that includes: a word line; a plurality of columns, each column in the plurality of columns including a bitcell at an intersection of the column with the word line, a sense amplifier, and a bit line coupled to a sense node for the sense amplifier through a charge-transfer transistor; a burst mode address comparator configured to determine for a series of read cycles whether each read cycle is a burst mode read cycle or a normal read cycle; and a bit line pre-charge circuit configured to pre-charge the bit line in each column in each normal read cycle, wherein the bit line pre-charge circuit is further configured to not pre-charge the bit line in each column in each burst mode read cycle.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
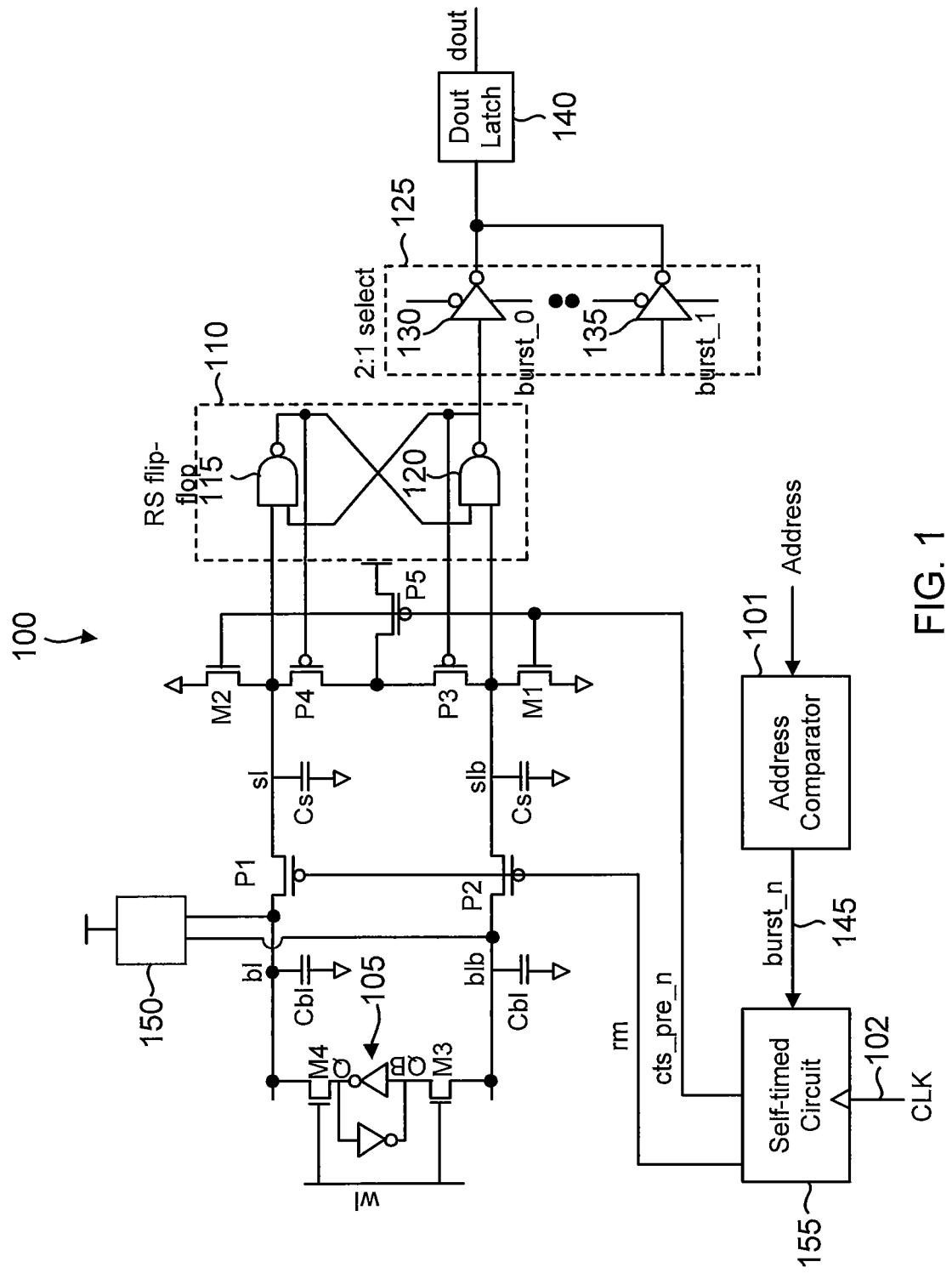
FIG. 1 illustrates an SRAM including a burst mode address comparator for invoking a burst mode of operation in accordance with an aspect of the disclosure.

A memory such as an SRAM is provided with a plurality of bitcells arranged according to rows and columns. Each column has a corresponding pair of bit lines. Each row has a corresponding word line. At each row and column intersection, there is a corresponding one of the bitcells. Prior to a normal (non-burst mode) read operation, the bit line pairs for the columns are pre-charged to a memory power supply voltage. A clock signal then triggers a self-timed clock circuit to assert a word line for an addressed one of the rows. The asserted word line switches on the row's access transistors so that the bitcells in the addressed rows can affect the pre-charged state of the bit lines. Depending upon the binary content of the addressed bitcells, one of the bit lines in each bit line pair will be discharged slightly below the memory power supply voltage while a second bit line in each bit line pair remains charged to the memory power supply voltage.

Each column has its own sense amplifier that latches a bit decision based upon the voltage difference developed across the column's bit line pair when the word line voltage is asserted. The columns are arranged into groups of multiplexed columns. Each column includes a bitcell at an intersection of the asserted word line with the multiplexed group of columns. These bitcells at the intersection with the word line with the group of multiplexed columns form a bitcell group such that only the bitcells' column address differs across the multiplexed group of columns. Each group of multiplexed columns includes a column multiplexer that selects from the group's columns to drive a corresponding data output latch. The selection by the column multiplexer depends upon the column address. Each sense amplifier includes a pair of sense amplifier nodes for coupling to the column's bit lines during a sense enable period in a normal read operation. The sense amplifier nodes are precharged prior to the normal read operation although this pre-charging may be to ground as compared to the pre-charging of the bit lines. The normal read operation ends with the bit decision from the addressed column being latched in the data output latch.

Whether a consecutive read operation is a normal read operation or a burst mode read operation depends upon whether the address for the consecutive read operation is directed to the same row. Note that during the normal read operation, each sense amplifier in the addressed group of multiplexed columns latched a bit decision for the bitcell group. A burst mode address comparator disclosed herein advantageously invokes the burst mode for the consecutive read operation if the same row is addressed as was addressed in the preceding read operation. In this fashion, the latched bit decisions from the preceding read operation are utilized without requiring the word line to be re-asserted. Similarly, the bit lines are not pre-charged nor are the sense amplifier nodes pre-charged so as to reduce power consumption.

Prior to the burst mode address comparator invoking the burst mode, a normal read operation should occur so that the sense amplifiers latch their bit decisions. Once the normal read operation occurs, the burst mode may be invoked again and again so long as the same row is being addressed. For example, suppose that that four columns are multiplexed and that an initial normal read operation occurs to a first column from the four columns. If a consecutive read operation is directed to the same row, the burst mode is activated. For example, a second column from the four columns may be read in a first burst mode read operation. A third column from the four columns may then be read in a second burst mode read operation, and so on. The word line, the bit lines, and the sense amplifier nodes are not precharged during the burst mode operations, which substantially reduces power consumption.

In general, the column address is typically smaller than the row address as the column multiplexing is generally smaller than the number of rows. For example, just two address bits are necessary to identify the addressed column for an embodiment with 4:1 column multiplexing. In contrast, the row address would be 7 bits to identify the addressed row in an embodiment with 128 rows. The following discussion will thus assume that the row address bits are the most-significant bits whereas the column address bits are the least-significant bits. In such an embodiment, the burst mode address comparator thus functions to determine whether the most significant bits of the read address for a current read operation are equal to the most significant bits for the read address in the preceding read operation. More generally, the burst mode address comparator functions to determine whether the row address portion of the current read address equals the row address portion of the preceding read address. If the row addresses are equal, the burst mode address comparator invokes the burst mode for the current read cycle. If the row addresses are not equal, the burst mode address comparator does not invoke the burst mode for the current read cycle.

The following discussion will be directed to advantageous charge-transfer embodiments for the implementation of the burst mode that is invoked by the burst mode address comparison disclosed herein. However, it will be appreciated that the burst mode address comparison as disclosed herein may be practiced by memories that do not implement charge-transfer. As noted above, each column in the group of multiplexed columns has its own sense amplifier. But density is not hindered by this lack of multiplexing a single sense amplifier across multiple columns because of a charge-transfer operation that is achieved through the control of charge-transfer transistors. Each bit line for a column couples to a sense amplifier node for the column's sense amplifier through a charge-transfer transistor. A source of each charge-transfer transistor couples to its bit line whereas a drain of each charge-transfer transistor couples to its sense amplifier node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that charge transfer may also be accomplished with n-type metal-oxide semiconductor (NMOS) transistors.

Prior to the word line assertion for the initial normal read operation, the bit lines are pre-charged to a power supply voltage whereas the sense amplifier nodes are all discharged. The word line is then asserted for a word line assertion period during which a bit line voltage difference develops for each bit line pair that depends upon the bit stored in each bitcell at the intersections of the word line and the bit line pairs for the group of multiplexed columns. Depending upon this bit, either a true bit line or a complement bit line in each bit line pair is discharged slightly from the pre-charged state (the power supply voltage). The resulting bit line voltage difference is not full rail but instead is just a fraction of the power supply voltage (e.g., approximately 100 mv). To form a bit decision from such a relatively small bit line difference traditionally requires a high-gain sense amplifier. Such a high-gain sense amplifier requires substantial die space so that it would typically be multiplexed across a group of columns. But the charge-transfer technique discussed herein results in an amplification of the bit line voltage difference across the pair of sense nodes for a bit line pair. Due to this amplification, a resulting sense amplifier does not need high gain but instead may be implemented by a reset-set (RS) latch that is relatively dense and has a relatively low power consumption. Each column may thus have its own sense amplifier.

The charge transfer occurs during a charge-transfer period that begins near an end of the word line assertion period. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value being read, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) for the charge-transfer transistor for the fully-charged bit line satisfies its threshold voltage. But the reduction in voltage for the partially-charged bit line is such that this same gate voltage does not satisfy the threshold voltage for the charge-transfer transistor for the partially-charged bit line. Thus, only the charge-transfer transistor for the fully-charged bit line in a bit line pair will initially conduct charge to its sense node. The capacitance of the sense node is relatively small compared to the capacitance of the bit line so the resulting charge transfer cause the sense node to be nearly charged to the power supply voltage. In contrast, the sense node for the partially-discharged bit line remains in its discharged default state such that the voltage difference between the sense nodes for an accessed bit line pair is nearly full rail (a voltage difference nearly equaling the power supply voltage). The charge transfer has thus resulted in an amplification of the relatively minor bit line voltage difference into a nearly-full-rail voltage difference on the sense nodes such that the sense amplifier may be a relatively compact and low-power RS latch such as formed by a pair of cross-coupled NAND gates. The sensing by the sense amplifier occurs in a sense enable period Since each column has its own sense amplifier, the charge-transfer period and sensing latches a bit decision for all the columns in the group of multiplexed columns during the initial read operation to the first bitcell. A burst mode address comparator is disclosed that selects for a burst mode read operation if a subsequent read operation is to another column in the group of multiplexed columns (assuming that the same word line is involved). For example, if the group of multiplexed columns had four columns, there would be four bitcells at the intersection of the word line and the four columns. More generally, there is a bitcell group corresponding to the intersection of a word line and a group of multiplexed columns. In an initial read operation to a bitcell in the bitcell group, the burst mode address comparator would detect that a previous read operation had been to a bitcell outside of the bitcell group. With regard to identifying whether a read address corresponds to the bitcell group or not, note that the address for the bitcells in a bitcell group will be substantially similar. For example, if the bitcell group is four bitcells, then the individual bitcell read addresses will only differ by two bits each. The remaining bits in the read addresses identify the word line and are thus the same for each bitcell in a bitcell group.

To identify whether a current read address and a preceding read address are directed to the same bitcell group, the burst mode address comparator need only determine that both addresses identify the same word line. The remaining bits in a read address depends upon which particular bitcell is being addressed in the bitcell group. The location of these bits in a read address depends upon the addressing convention. The following discussion will assume without loss of generality that it is the least-significant-bits (LSBs) that identify the bitcell within a bitcell group. Thus, the burst mode address comparator in such an embodiment would activate a burst mode read operation upon determining that the most-significant bits (MSBs) are the same for the current read address and the preceding read address. So long as the burst mode is activated, each consecutive read operation is performed merely through the column multiplexer selecting for the appropriate column in the group of multiplexed columns. The word line is not asserted for these additional burst mode read operations nor are the bit lines and sense nodes pre-charged so as to provide advantageous power savings. Some example implementations will now be described in more detail.

An example SRAM 100 is shown in FIG. 1 that includes a burst mode address comparator 101. A bit line pair of a bit line bl and a complement bit line blb form a first column. A bitcell 105 lies at an intersection of the first column and a word line wl. Bitcell 105 is formed by a pair of cross-coupled inverters. The output node of a first one of the inverters is the true (Q) output for bitcell 105. This output node couples to the bit line bl through an NMOS access transistor M4. Similarly, the output node of a remaining second one of the inverters is the complement (QB) output for bitcell 105 that couples to the complement bit line blb through an NMOS access transistor M3. The word line wl couples to the gates of the access transistors so that the Q and QB nodes drive their respective bit lines during a word line assertion period.

SRAM 100 includes a second column having a bitcell at its intersection with word line wl. Since the second column is a repeat of the structure in the first column, the details for the second column are not shown in FIG. 1 for illustration clarity. The two columns are multiplexed through a column multiplexer 125. Should the read operation (burst or non-burst) be directed to bitcell 105, column multiplexer 125 selects for a sense amplifier output from a sense amplifier 110 for the first column. For example, column multiplexer 125 may include a tri-state buffer 130 for the first column and a tri-state buffer 135 for the second column. The tri-state buffer for the un-selected column is tri-stated to form the selection in column multiplexer 125. The output of column multiplexer 125 is latched in a data output latch 140.

Bitcell 105 for the first column and the corresponding bitcell in the second column form a bitcell group that share a common address that identifies word line wl and the group of multiplexed columns. Only the column address changes within the bitcell group. Regardless of whether a read operation occurs with or without the burst mode, each read operation is responsive to a clock cycle such as for a memory clock signal 102. Suppose that a first memory clock cycle corresponds to a read operation involving a different word line and/or column and that this first memory clock cycle is followed by a second memory clock cycle in which a read operation is directed to bitcell 105. For this second read operation, burst mode address comparator 101 does not activate the burst mode since the previous address decoded in the first memory clock cycle identified a different word line and/or a different group of multiplexed columns.

Prior to the word line assertion during a normal read operation, bit lines bl and blb were pre-charged to the power supply voltage by a bit line pre-charge circuit 150. Such pre-charging of the bit lines is conventional and thus the details for bit line pre-charge circuit 150 are not illustrated in FIG. 1. The timing of various actions such as the pre-charging of the bit lines, the pulse width for the word line assertion, and the enabling of sense amplifier 110 during a read operation is controlled by a self-timed clock circuit 155 as triggered by memory clock signal 102. The timing of these actions during a normal read operation is conventional. However, self-timed clock circuit 155 is modified from such conventional function to accommodate the burst mode. Self-timed clock circuit 155 is thus responsive to a burst mode signal such as an active-low burst mode signal 145 (burst n) so that the word line is not asserted, the bit lines are not pre-charged, and the charge-transfer transistors are not switched on during a burst mode operation.

To control whether the burst mode is active, burst mode address comparator 101 asserts or de-asserts burst mode signal 145. As used herein, a signal is said to be "asserted" when the signal has a logical true state, regardless of whether the logical true state is active high or active low. In alternative embodiments, the burst mode signal may instead be an active high signal. Should burst mode address comparator 101 not assert burst mode signal 145, SRAM 100 implements a normal read operation in which the second memory clock cycle triggers a charging of the voltage for word line wl by self-timed clock circuit 155. Prior to this word line assertion, bit lines bl and blb were pre-charged to the power supply voltage by bit line pre-charge circuit 150. Following the bit line pre-charging, bit line pre-charge circuit 150 floats the bit lines. Bit line bl couples to a corresponding sense node sl for sense amplifier 110 through a PMOS charge-transfer transistor P1. Similarly, complement bit line blb couples a to a corresponding sense node sib through a PMOS charge-transfer transistor P2. Prior to the word line assertion, a gate voltage rm for the charge-transfer transistors is charged to the power supply voltage by self-timed clock circuit 155 to prevent any charge transfer to the sense nodes. Since the burst mode is not active, self-timed clock circuit 155 charges a sense node pre-charge signal (cts_pre_n) to a power supply voltage prior to the word line assertion. The charged sense node pre-charge signal drives the gates of an NMOS transistor M1 and an NMOS transistor M2. The sources of transistors M1 and M2 are tied to ground whereas their drains are tied to complement sense node slb and sense node sl, respectively. The assertion of the sense node pre-charge signal will thus discharge both the sense node sl and the sense node slb for the first column since both transistors M1 and M2 are switched on to couple their respective bit lines to ground. As noted earlier, the second column has the same structure as shown for the first column.

Both columns will thus have their sense nodes discharged and their bit lines pre-charged prior to the word line assertion for a normal read operation in which the burst mode is not active. But if a consecutive read operation is directed to the second column, burst mode address comparator 101 activates the burst mode by asserting burst mode signal 145. Self-timed clock circuit 155 responds to the assertion of burst mode signal 145 by preventing the assertion of the word line wl. Similarly, the gate voltage signal rm is maintained at a power supply voltage by self-timed clock circuit 155 during the burst mode to prevent the charge-transfer transistors P1 and P2 from conducting. In addition, self-timed clock circuit 155 maintains the sense amplifier precharge signal cts_pre_n at ground during the burst mode read operation to prevent the pre-charging of the sense nodes sl and slb.

During a normal read operation, the switching on of the access transistors M4 and M3 by the assertion of the word line voltage causes one of the bit line bl or blb to discharge slightly from its pre-charged state depending upon the binary content stored in bitcell 105. This slight bit line discharge is amplified by the charge-transfer period during which charge-transfer transistors P1 and P2 are switched on as follows. The charge-transfer period is triggered by the discharge of gate voltage rm. This discharge of the gate voltage rm begins while the word line voltage is still asserted. The discharge of the gate voltage rm may end after the word line voltage has been discharged. The discharge of the gate voltage rm has some slope to it. Due to this less-than-instantaneous discharge of the gate voltage rm, the gate voltage rm will discharge to the threshold voltage for the charge-transfer transistor having its source tied to the fully-charged bit line but will still be above the threshold voltage for the charge-transfer transistor having its source tied to the partially-discharged bit line. The charge-transfer transistor for the fully-charged bit line will thus conduct charge to its sense node prior to when the other charge-transfer transistor conducts charge from the partially-discharged bit line. For example, suppose that bit line bl is the fully-charged bit line such that charge-transfer transistor P1 begins conducting before charge-transfer transistor P2. The sense node voltage sl will thus increase prior to the increase of the complement sense node voltage slb.

Sense node sl is connected to an input of a NAND gate 115 in sense amplifier 110. Similarly, sense node slb ties to an input of a NAND gate 120 in sense amplifier 110. NAND gates 115 and 120 are cross-coupled to form an RS latch. The pre-charging to zero volts of the sense nodes causes both outputs of NAND gates 115 and 120 to be asserted high to the power supply voltage. The output of NAND gate 120 also forms an output terminal for the first column. The corresponding NAND gate in the second column (not illustrated) forms an output terminal for the second column. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 conducts thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 110.

If the read operation is to the first column, column multiplexer 125 selects for the output terminal of sense amplifier 110 in the first column so that the binary content of bitcell 105 is latched into data output latch 140 in the first memory cycle. But note that the sense amplifier for the second column has also latched the bit stored in the remaining bitcell in the bitcell group. This bit sensing will not be discarded if a consecutive read operation is directed to this remaining bitcell. Burst mode address comparator 101 detects that the address for the second read operation is directed to the same bitcell group and thus triggers the burst mode for the second memory clock cycle by asserting burst mode signal 145. In response to the assertion of burst mode signal 145, self-timed clock circuit 155 prevents the charging of the word line wl voltage during the second memory clock cycle. Similarly, self-timed clock circuit 155 prevents the sense node pre-charge signal from being asserted during the second memory clock cycle. In addition, self-timed clock circuit 155 also prevents a discharge of the gate voltage rm during the second memory clock cycle due to the burst mode operation. Column multiplexer 125 then selects for the second column through tri-state buffer 135 so that the bit from the second column's bitcell may be stored in data output latch 140.

To assist the latching within sense amplifier 110, the sense node pre-charge signal drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. For example, suppose that the output of NAND gate 115 is low. This low output switches on transistor P4 to reinforce the fully-charged state of sense node sl, which in turn reinforces the zero output for NAND gate 115. Conversely, suppose that the output of NAND gate 120 is low following a sense enable period. Transistor P3 would then be switched on. The switching on of transistor P3 reinforces the fully-charged state of complement sense node slb, which in turn reinforces the zero output of NAND gate 120. In this fashion, the latching of the sensed bit in sense amplifier 110 is strengthened or reinforced.

Figure 2:
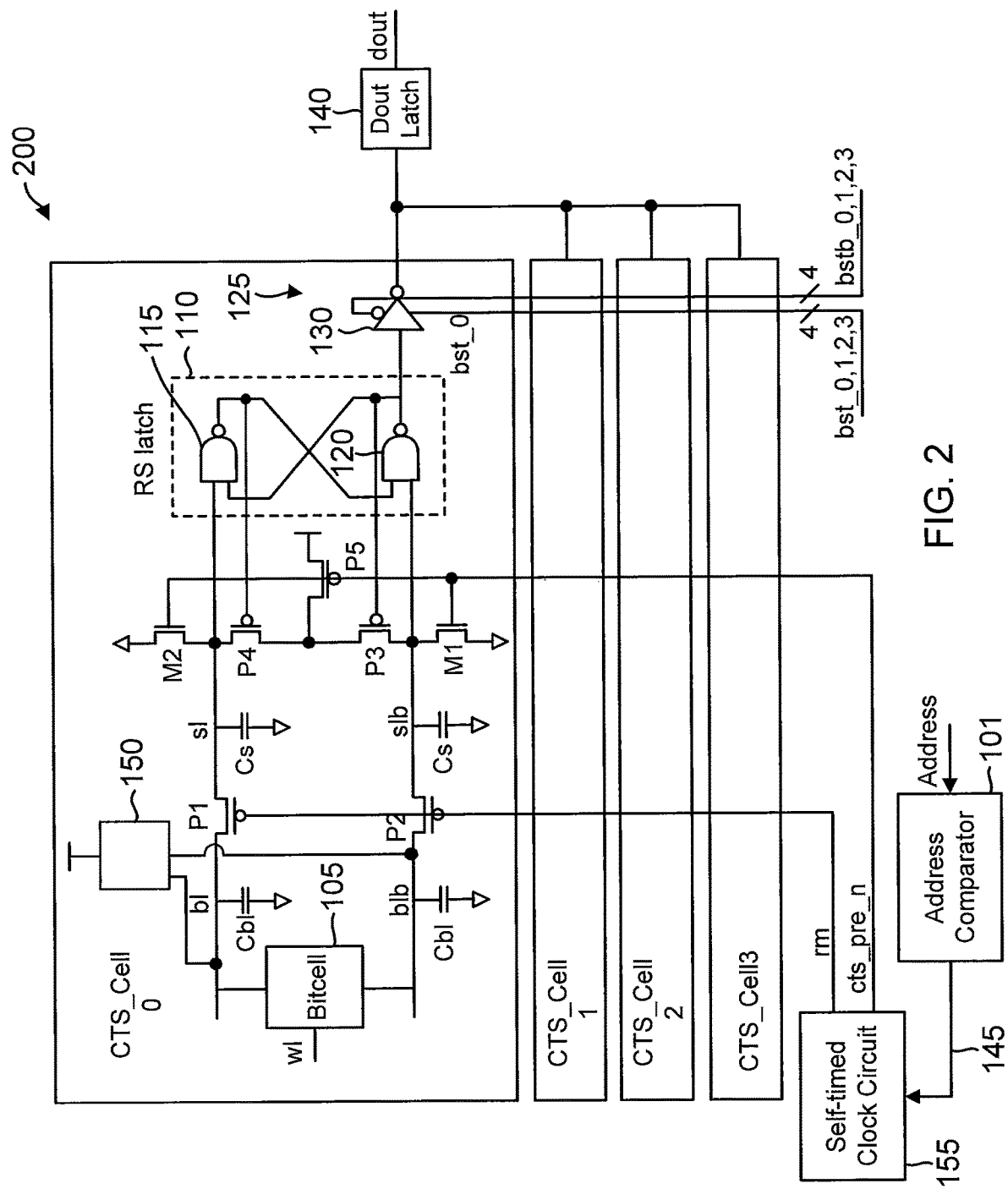
FIG. 2 illustrates a modification of the SRAM of FIG. 1 in which the column multiplexing is a 4:1 multiplexing in accordance with an aspect of the disclosure.

It will be appreciated that the burst mode operation disclosed herein is not limited to any particular column multiplexing size. For example, an SRAM 200 is shown in FIG. 2 in which four columns are multiplexed by a column multiplexer 125, ranging from a first column CTS_Cell0 to a fourth column CTS_Cell3. Each column has a bitcell at the column's intersection with word line wl. The structure within each column is as discussed with regard to SRAM 100. For illustration clarity, only first column CTS_Cell0 is shown in detail. Since there are four columns in the group of multiplexed columns that share data output latch 140, there are four decoded bits bst_0, bst_1, bst_2, and bst_3 as well as their complements that control which column is selected by column multiplexer 125. Column multiplexer 125 is implemented with tri-state buffers including tri-state buffer 130 as discussed with regard to memory 100 but it will be appreciated that other types of column multiplexers may be used in SRAM 200. The gate voltage rm controls the pre-charge transistors in each column. Similarly, the sense node pre-charge signal (cts_pre_n) controls the pre-charging of the sense nodes through transistors M1 and M2 in each column as well as the latch reinforcement through transistors P3, P4, and P5 in each column as discussed with regard to SRAM 100.

Since there are four columns, just two bits (for example, two least-significant bits) will differ for each bitcell address in the bitcell group. During an initial non-burst-mode read operation, the discharge of the gate voltage rm may be performed by an inverter (not illustrated) in self-timed clock circuit 155. The inverter is relatively small so that the discharge of the gate voltage rm has some slew so that the amplification of the bit line voltage differences occurs with respect to the charge transfer to the corresponding sense nodes. Depending upon which column is addressed, the corresponding bit from the addressed bitcell is selected by column multiplexer 125 and latched into data output latch 140. However, sense amplifier 110 in each of the four columns latches its corresponding bit decision. If a subsequent read operation is directed to the same bitcell group, burst mode address comparator 101 activates the burst mode.

Figure 3:
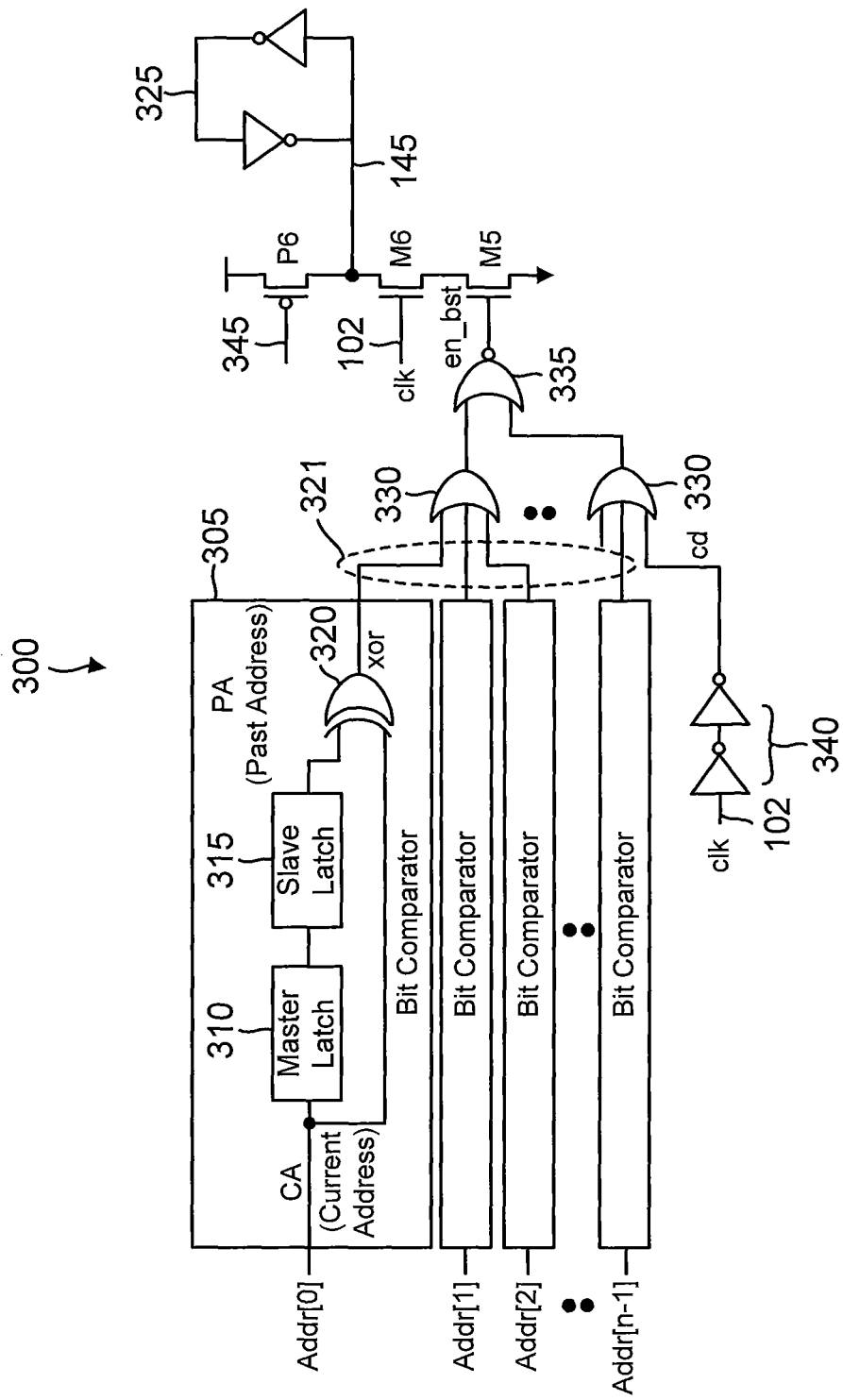
FIG. 3 is a circuit diagram for an example burst mode address comparator in accordance with an aspect of the disclosure.

An embodiment 300 for burst mode address comparator 101 is shown in more detail in FIG. 3. The read address is n bits wide ranging from a zeroth address bit Addr[0] to an (n−1)th address bit Addr[n−1]. Each address bit for a current read cycle is compared to the corresponding bit for a preceding read cycle by a corresponding bit comparator 305. There is thus a bit comparator 305 for address bit Addr[0], a bit comparator 305 for address bit Addr[1], a bit comparator 305 for address bit Addr[2], and so on until a final bit comparator 305 is provided for the final address bit Addr[n−1]. Each bit comparator 305 forms a one-bit output signal having a binary state that depends on the corresponding bit comparison. Since there are n bit comparators 305 for the n-bit-wide read address, their one-bit output signals form an n-bit-wide bit comparison word 321.

Each bit comparator 305 includes a master latch 310 and a slave latch 315 that successively latch the corresponding bit from the read address. As used herein, the term "latch" refers to any suitable storage element that may either be synchronous (e.g., a register or flip-flop) or asynchronous (e.g. a reset-set latch). The delay through the master and slave latching is one memory clock cycle so that the address bit stored by slave latch 315 is the address bit from the preceding memory clock cycle. Each bit comparator also includes an XOR gate 320 that exclusively ORs the corresponding current address bit and the corresponding previous address bit from its slave latch 315. The one-bit output signal from each XOR gate 320 will thus be grounded if the corresponding address bit and the corresponding previous address bit are the same. N-bit wide comparison word 321 will thus be all zeroes if the current memory read cycle is directed to the same bitcell group (same word line address). The comparison word is thus an active-low signal that is asserted to invoke the burst mode. In contrast, at least one of the bits in this N-bit wide comparison word will be charged to the memory power supply voltage if the current memory read cycle is not directed to the same bitcell group that was addressed in the preceding memory clock cycle. XOR gates 320 are an example of a first plurality of logic gates configured to assert the bit comparison word responsive to a current row address for the memory equaling the previous row address.

A plurality of OR gates 330 arranged in parallel process the N-bit wide output signal formed by XOR gates 320. XOR gates 320 are arranged into XOR gate groups such that the output bits from each group of XOR gates 320 drive a corresponding one of OR gates 330. The input width of each OR gate 330 is three bits but this input width may be increased or decreased in alternative embodiments. A final one of the OR gates 330 also ORs a delayed version of memory clock signal 102 as delayed by an even number of inverters 340 to produce a delayed clock signal (cd). The outputs of OR gates 330 are processed by a NOR gate 335. The output of NOR gate 335 will thus be high for a delay period following the rising edge of memory clock signal 102 only if the row address for the current memory read cycle equals the row address for the preceding memory read cycle. The length of the delay period is determined by the delay through inverters 340. The output of NOR gate 335 drives a gate of an NMOS transistor M5 having a source connected to ground. A drain for transistor M5 will thus be grounded if the output of NOR gate 335 is high in response to the current row address matching the preceding row address. Transistor M5 may also be denoted as a first transistor.

The drain of transistor M5 connects to a source of an NMOS transistor M6, which may also be denoted as a second transistor. Since memory clock signal 102 drives the gate of transistor M6, a drain of transistor M6 will be grounded in response to a rising edge of memory clock signal 102 while the current row address matches the preceding row address for two consecutive read operations. Once the delay period established by inverters 340 expires, the output of NOR gate 335 will go low to switch off transistor M5. The drain voltage of transistor M6 forms a burst mode node for burst mode signal 145. Burst mode signal 145 will thus be discharged to ground to signify that the burst mode is active if the current row address matches the preceding row address. A pulse latch 325 formed by a pair of inverters latches burst mode signal 145. In one embodiment, OR gates 330 and NOR gate 335 are an example of a second plurality of logic gates configured to switch on the first transistor (M5) to ground the burst mode node responsive to the assertion of the bit comparison word.

Burst mode signal 145 is re-evaluated for each consecutive read operation. Burst mode signal 145 should thus be reset by being charged to the memory power supply voltage before the next cycle of memory clock signal 102. For example, burst mode signal 145 may be reset by a PMOS transistor P6 having a drain connected to the drain of transistor M6. Transistor P6 may also be denoted as a third transistor. The source of transistor P6 is connected to a power supply node for the memory power supply voltage. If transistor P6 is switched on, the drain of transistor M6 and thus burst mode signal 145 will be charged to the memory power supply. A self-timed clock signal 345 produced by self-timed clock circuit 155 drives a gate of transistor P6 to control whether burst mode signal 145 is reset. Self-timed clock circuit 155 uses a falling edge of self-timed clock signal 345 to trigger a release of the word line during a normal read operation. Although self-timed clock circuit 155 does not assert the word line during a burst mode operation, the falling edge of self-timed clock signal 345 is a convenient signal to control the reset of burst mode signal 145. In alternative embodiments, other suitable signals such as the falling edge of memory clock signal 102 may be used to drive the gate of transistor P6 to control the reset of burst mode signal 145.

Figure 4:
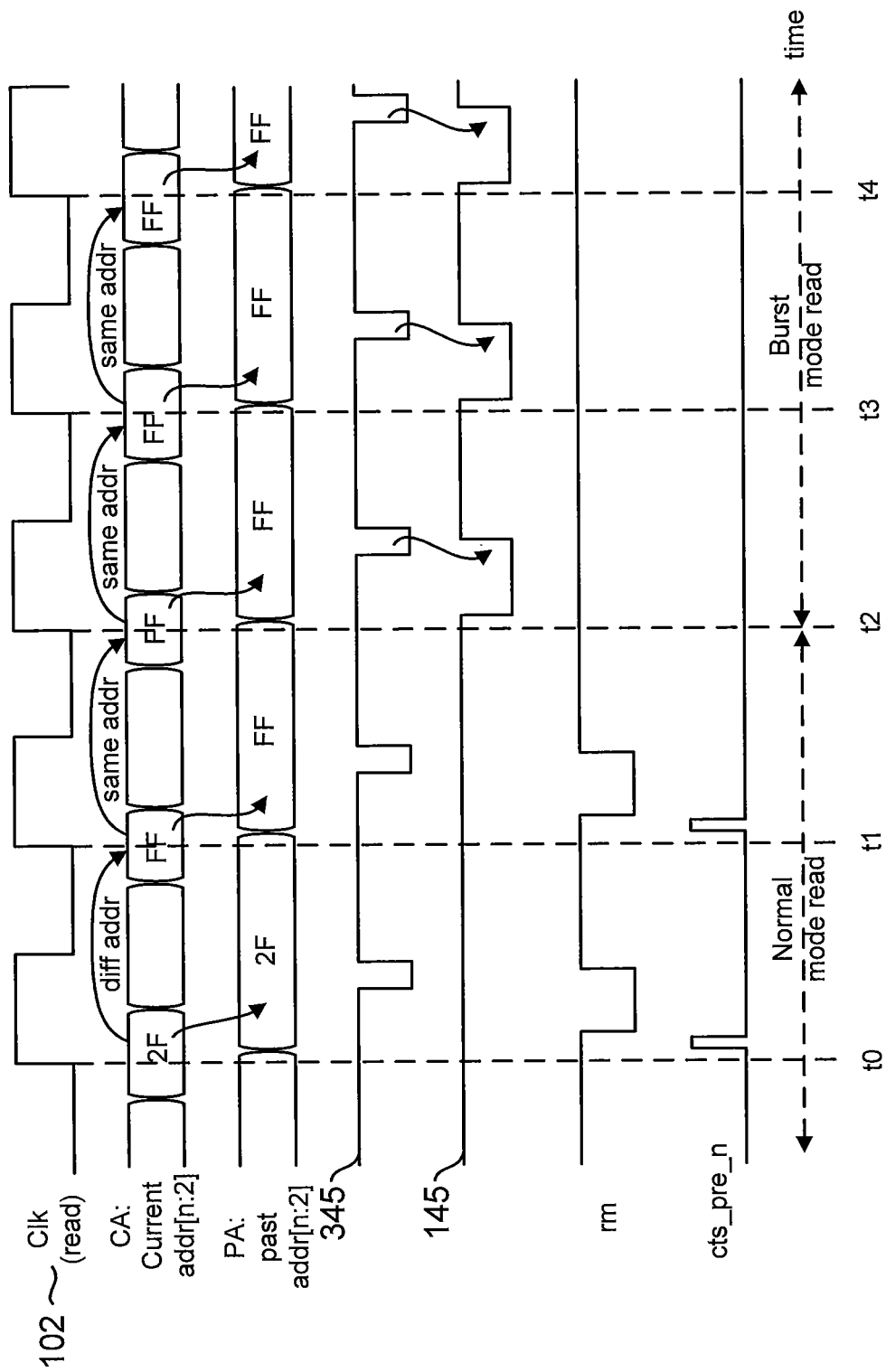
FIG. 4 is a timing diagram for various signals in the SRAM of FIG. 2.

In light of this address comparator control of the burst mode, the timing of various signals for memory 200 will now be discussed with regard to FIG. 4. Memory clock signal 102 begins an initial read cycle at a time to. There can be no burst mode in this clock cycle because there is no preceding read address for comparison. The read address for this read cycle is an n-bit word. Since memory 200 has 4:1 column multiplexing, the column address for a read operation in memory 200 is two bits wide. The row address portion for the read address in each read cycle for memory 200 is thus the portion [n:2] of the n-bit wide read address. During the initial read cycle, a current address (CA) read address portion (2F) at time t0 is latched into slave latches 315 (FIG. 3). The current read address portion 2F thus becomes a previous address (PA) for a subsequent read operation as triggered by a rising edge of memory clock signal 102 at a time t1.

During the normal read operation beginning at time t0, the sense amplifier nodes are precharged by the assertion of the sense node pre-charge signal cts_pre_n as controlled by self-timed clock circuit 155. Self-timed clock circuit 155 also asserts the active-low gate voltage rm for the charge-transfer transistors. The falling edge of self-timed clock signal 345 triggers the de-assertion of the gate voltage rm.

A second read cycle is triggered by the rising edge of memory clock signal 102 at a time t1. The current row address for the second read cycle is FF, which is different from the previous row address 2F. Burst mode signal 145 stays unasserted by remaining at the memory power supply voltage so that the second read cycle is also a normal read operation. The same signal timing as discussed for the first read cycle is thus repeated for the second read cycle.

The rising edge of memory clock signal 102 at a time t2 begins a third read cycle. The current row address FF is the same as the previous row address. Burst mode signal 145 is thus asserted low following the rising edge of memory clock signal 102 at time t2 to activate the burst mode. The gate voltage rm and the sense node precharge signal cts_pre_n are thus not asserted during the third read cycle. The falling edge of self-timed clock signal 345 resets burst mode signal 145 during the third read cycle.

The rising edge of memory clock signal 102 at a time t3 triggers a fourth read cycle. The current row address FF is the same as the previous row address. Burst mode signal 145 is thus asserted low following the rising edge of memory clock signal at time t3 to again activate the burst mode. Similarly, the row address for fifth read cycle beginning at a time t4 is also FF so the burst mode is again activated for the fifth read cycle.

Figure 5:
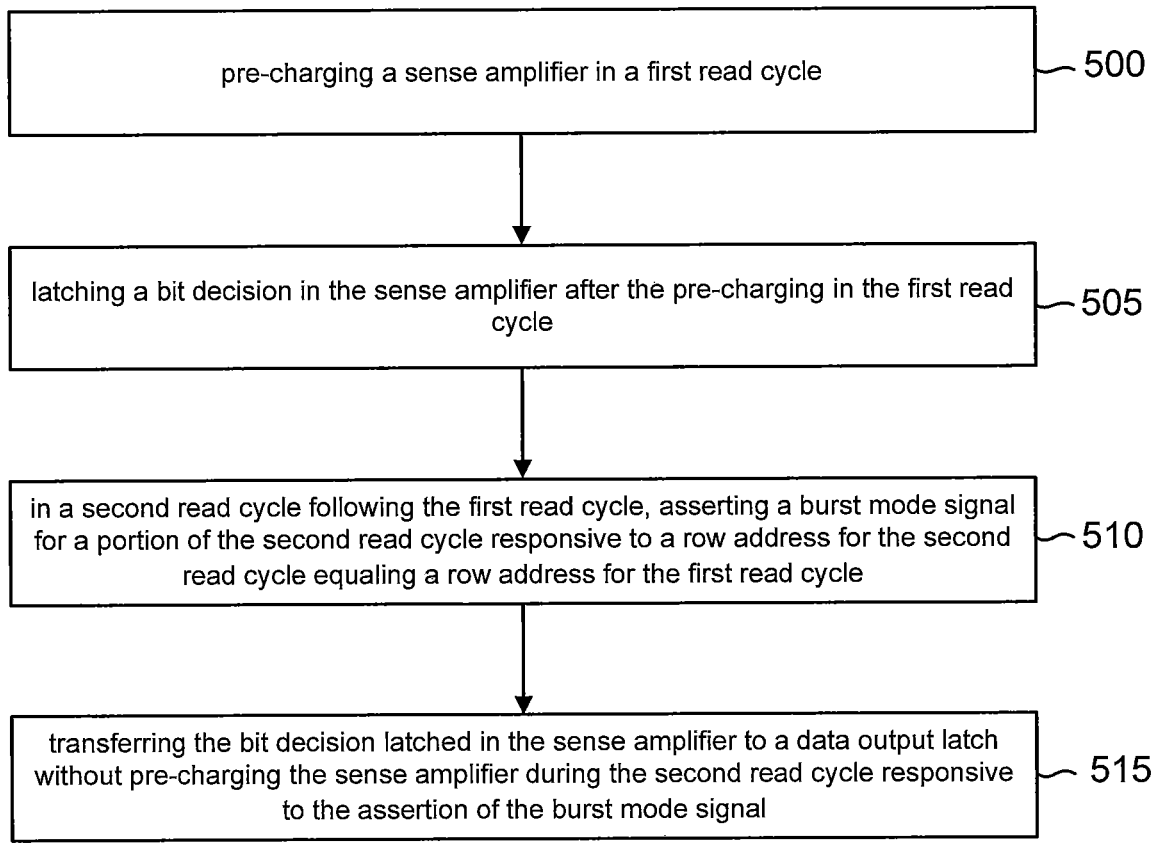
FIG. 5 is a flowchart of a burst mode address comparison method in accordance with an aspect of the disclosure.

A method of burst mode address comparison will now be discussed with regard to the flowchart of FIG. 5. The method includes an act 500 of pre-charging a sense amplifier in a first read cycle. The pre-charging of sl and slb in memories 100 or 200 is an example of act 500. The method further includes an act 505 of latching a bit decision in the sense amplifier after the pre-charging in the first read cycle. The latching of RS flip-flop 110 is an example of act 505. In addition, the method includes an act 510 that occurs in a second read cycle following the first read cycle and includes asserting a burst mode signal for a portion of the second read cycle responsive to a row address for the second read cycle equaling a row address for the first read cycle. The assertion of burst mode signal 145 during a burst mode read operation is an example of act 510. Finally, the method includes an act 515 of transferring the bit decision latched in the sense amplifier to a data output latch without pre-charging the sense amplifier during the second read cycle responsive to the assertion of the burst mode signal. The transfer of the bit decision through column multiplexer 125 to data output latch 140 during a burst mode read cycle is an example of act 515.

Figure 6:
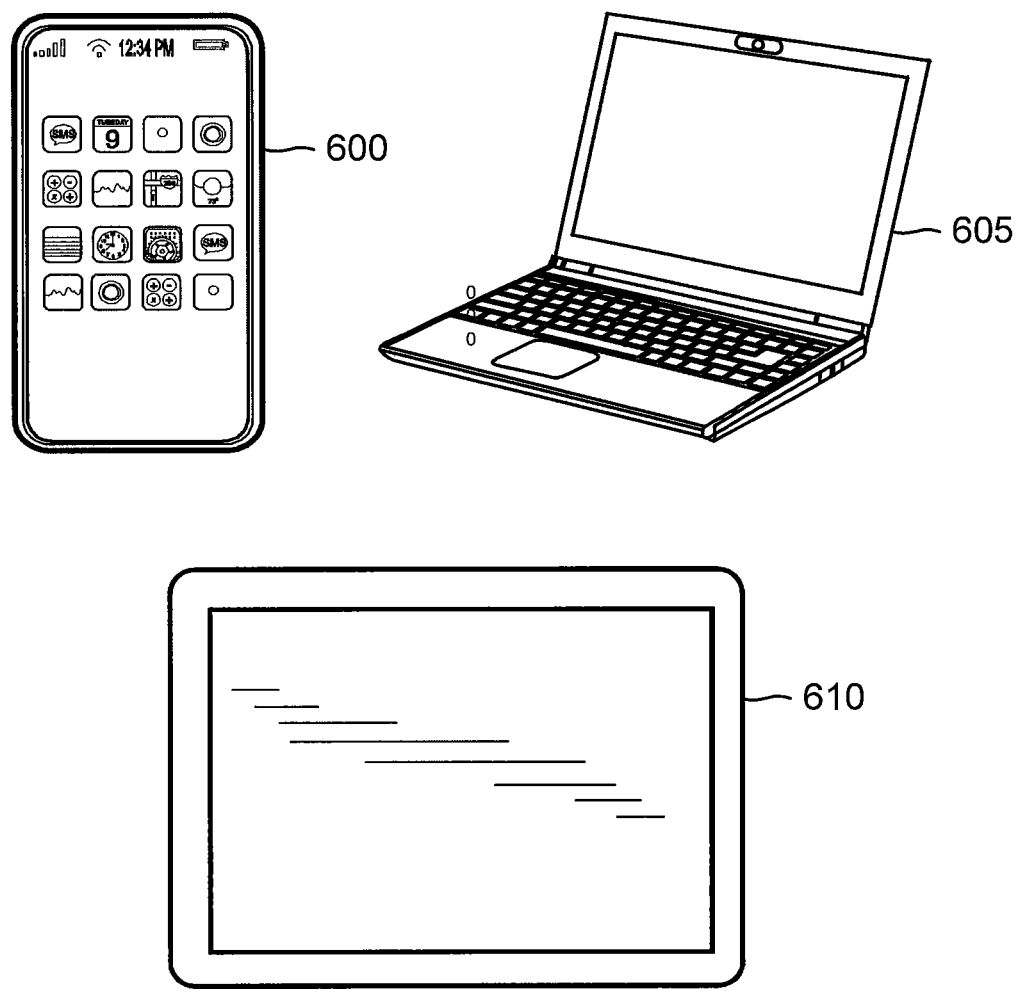
FIG. 6 illustrates some example electronic systems each incorporating an SRAM with burst mode address comparison in accordance with an aspect of the disclosure.

A memory with burst mode address comparison as disclosed herein may be incorporated into a wide variety of electronic systems. For example, as shown in FIG. 6, a cellular telephone 600, a laptop computer 605, and a tablet PC 610 may all include a memory having a burst mode address comparator in accordance with the disclosure. Other exemplary electronic systems such as a music player, a video player, a communication device, and a personal computer may also be configured with burst mode address comparators constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
    a plurality of latches configured to store a previous row address for the memory;
    a first plurality of logic gates configured to assert a bit comparison word responsive to a current row address for the memory equaling the previous row address;
    a first transistor having a terminal coupled to a burst mode node for a burst mode signal; and
    a second plurality of logic gates configured to switch on the first transistor to ground the burst mode node responsive to the assertion of the bit comparison word.

2. The memory of claim 1, further comprising:
    a second transistor coupled between the terminal of the first transistor and the burst mode node, wherein the second transistor is configured to switch on responsive to a memory clock signal for the memory.

3. The memory of claim 1, wherein the plurality of latches comprises a plurality of master-slave latches.

4. The memory of claim 1, wherein the first plurality of logic gates comprises a plurality of XOR gates.

5. The memory of claim 4, wherein the plurality of XOR gates are arranged into a plurality of XOR gate groups, and wherein the second plurality of logic gates comprises:
    a plurality of OR gates corresponding to the plurality of XOR gate groups, wherein each OR gate in the plurality of OR gates is configured to process an output signal from each XOR gate in the corresponding XOR gate group; and
a NOR gate configured to NOR an output signal from each OR gate, wherein the NOR gate is further configured to drive a gate of the first transistor.

6. The memory of claim 5, wherein a final one of the OR gates is further configured to process a delayed version of a memory clock signal for the memory.

7. The memory of claim 2, further comprising:
a self-timed clock circuit configured to assert a self-timed clock signal responsive to the memory clock signal; and
a third transistor coupled between a power supply node for a memory power supply voltage and the burst mode node, wherein the third transistor is configured to switch on responsive to a falling edge of the self-timed clock signal.

8. The memory of claim 7, wherein the first transistor is an n-type metal-oxide semiconductor (NMOS) transistor, the second transistor is an NMOS transistor, and the third transistor is a p-type metal-oxide (PMOS) transistor.

9. The memory of claim 1, further comprising;
a first column including a first sense amplifier configured to sense a first bit from a first bitcell through a first pair of sense nodes to output the first bit at a first output terminal for the first column,
a second column including a second sense amplifier configured to sense a second bit from a second bitcell through a second pair of sense nodes and to output the second bit at a second output terminal for the second column;
a data output latch;
a column multiplexer configured to select between the first bit from the first output terminal and the second bit from the second output terminal to provide a selected bit to the data output latch;
a sense node pre-charge circuit configured to pre-charge the first pair of sense nodes and the second pair of sense nodes responsive to an assertion of a sense node pre-charge signal; and
a self-timed clock circuit configured to assert the sense node pre-charge signal in read cycles in which the burst mode signal is not asserted.

10. The memory of claim 9, wherein the first sense amplifier comprises a first reset-set latch, and wherein the second amplifier comprises a second reset-set latch.

11. The memory of claim 10, wherein the first pair of sense nodes comprises a first sense node and a second sense node, and wherein the sense node pre-charge circuit comprises a first transistor coupled between the first sense node and ground and further comprises a second transistor coupled between the second sense node and ground.

12. The memory of claim 11, wherein the first column includes a bit line coupled through a first charge-transfer transistor to the first sense node and further includes a complement bit line coupled through a second charge-transfer transistor to the second sense node, wherein the self-timed clock circuit is further configured to maintain the first charge-transfer transistor and the second charge-transfer transistor off in read cycles in which the burst mode signal is asserted.

13. The memory of claim 12, wherein the first charge-transfer transistor and the second charge-transfer transistor are both p-type metal-oxide semiconductor (PMOS) transistors.

14. The memory of claim 1, wherein the memory is incorporated in a cellular telephone.

15. The memory of claim 1, wherein the memory is incorporated in a laptop computer.

16. A burst-mode method for a memory, comprising:
pre-charging a sense amplifier in a first read cycle:
latching a bit decision in the sense amplifier after the pre-charging in the first read cycle;
in a second read cycle following the first read cycle, asserting a burst mode signal for a portion of the second read cycle responsive to a row address for the second read cycle equaling a row address for the first read cycle;
transferring the bit decision latched in the sense amplifier to a data output latch without pre-charging the sense amplifier during the second read cycle responsive to the assertion of the burst mode signal.

17. The method of claim 16, further comprising:
asserting a word line during the first read cycle;
while the word line is asserted, initiating a charge-transfer period in which a first charge transfer from a first pre-charged bit line in a first column to a first sense node for the sense amplifier depends upon a binary value of a first bit; and
sensing the first bit responsive to the first charge transfer to form the bit decision latched in the sense amplifier.

18. The burst-mode method of claim 17, further comprising:
discharging the first sense node prior to the charge-transfer period.

19. The burst-mode method of claim 16, wherein the first sense node is not discharged during the second read cycle responsive to the assertion of the burst mode signal.

20. A memory, comprising:
a word line;
a plurality of columns, each column in the plurality of columns including a bitcell at an intersection of the column with the word line, a sense amplifier, and a bit line coupled to a sense node for the sense amplifier through a charge-transfer transistor;
a burst mode address comparator configured to determine for a series of read cycles whether each read cycle is a burst mode read cycle or a normal read cycle;
a bit line pre-charge circuit configured to pre-charge the bit line in each column in each natural read cycle, wherein the bit line pre-charge circuit is further configured to not pre-charge the bit line in each column in each burst mode read cycle.

21. The memory of claim 20, further comprising:
a self-timed clock circuit, wherein the self-timed clock circuit is configured to assert the word line in each normal read cycle and to not assert the word line in each burst mode read cycle.

22. The memory of claim 21, wherein the self-timed clock circuit is further configured to prevent a pre-charge of the sense nodes during each burst mode read cycle.

* * * * *